(12) United States Patent
Wong et al.

(10) Patent No.: US 6,291,984 B1
(45) Date of Patent: Sep. 18, 2001

(54) DUAL MODE DIODE POWER SENSOR WITH SQUARE LAW AND LINEAR OPERATING REGIONS

(75) Inventors: Vincent W. C. Wong, Morgan Hill, CA (US); Chris Turl, Letchworth Herts (GB); William W. Oldfield, Redwood City; Kenneth C. Harvey, Los Gatos, both of CA (US)

(73) Assignee: Anritsu Company, Morgan Hill, CA (US)

( * ) Notice: Subject to any disclaimer, the term of this patent is extended or adjusted under 35 U.S.C. 154(b) by 0 days.

(21) Appl. No.: 09/470,149

(22) Filed: Dec. 22, 1999

Related U.S. Application Data

(63) Continuation-in-part of application No. 09/336,607, filed on Jun. 18, 1999.
(51) Int. Cl.[7] ................................................. G01R 15/00
(52) U.S. Cl. ..................... 324/132; 324/115; 324/119; 324/95
(58) Field of Search .................................. 324/119, 115, 324/105, 95, 132; 702/85, 86, 107

(56) References Cited

U.S. PATENT DOCUMENTS 4,943,764  7/1990  Szente et al. .......................... 324/95

*Primary Examiner*—Ernest Karlsen
(74) *Attorney, Agent, or Firm*—Fliesler Dubb Meyer & Lovejoy LLP

(57) ABSTRACT

A dual mode power meter provides a first operation mode in the square law operating range of the diode, and a second mode in the square law region as well as the transition and linear operating ranges of the diode. The power meter includes multiple diodes. A manifold made up of power dividers distributes a signal input to the power meter to the diodes. A different attenuation is provided to each diode so that the square law operating range for each diode covers a different power range. By selecting the appropriate diode output for power measurements in the first mode, the overall square law operating range for the power meter will be greater than a power meter using a single diode. The power meter further includes a memory map of voltage vs. power in the square law, transition and linear regions of a diode measured for an unmodulated CW input for the second operation mode. The map of voltage vs. power enables power to be measured faster in the second mode for unmodulated CW signals provided to the power meter which are beyond the square law operating region for the diodes of the power meter.

17 Claims, 5 Drawing Sheets

TYPICAL DIODE I-V CURVE

DUAL MODE DIODE POWER SENSOR WITH SQUARE LAW AND LINEAR OPERATING REGIONS

CROSS-REFERENCE TO RELATED APPLICATION

This is a continuation-in-part of U.S. patent application Ser. No. 09/336,607 entitled "RMS Power Sensor With 84 dB Dynamic Range", by Wong, et al., filed Jun. 18, 1999, and claims priority therefrom.

BACKGROUND OF THE INVENTION

1. Field of the Invention

The present invention relates to diode power sensors designed to measure power over a wide dynamic range. The present invention further relates to measuring power both within the square law operating range of a diode and outside the square law operating range.

1. Description of the Related Art

Diode power sensors take advantage of a square law operating region of a diode to measure power. The current (I) vs. voltage (V) equation for a diode is typically expressed in an exponentional form according to the equation $$I = I_0(e^{(\eta V/kT)} - 1) \quad (1)$$

where Io and η are constants whose values depend on the details of the diode, T is the diode's temperature in Kelvins and k is Boltsmann's constant. FIG. 1 shows an ideal I-V curve for a Schottky or PN-Junction type diode following the parameters of equation (1).

A diode's I-V behavior can also be represented in terms of a polynomial series, $$I = \sum a_n V^n \quad (2)$$

where the $a_n$ values are chosen to suit a particular diode being considered. For a diode receiving a sinusoidal voltage, average current can be calculated using the second order term of equation (2), while other terms of equation (2) can be neglected over a portion of the diode I-V curve. Equation (2) can, thus, be simplified for average sinusoidal current as:

$$I_{avg} = a(V^2)_{avg} \quad (3)$$

The portion of the I-V curve where a diode operates according to equation (3) is referred to as the square law region.

A power sensor which measures RMS power can be constructed using a Schottky or PN-Junction diode to take advantage of the I-V square law relation of the diode. RMS power can then be determined by measuring average diode current. Power is determined according to the equation $$P = (V^2)_{avg}/2R \quad (4)$$

where P is average power, and R is the load resistance of typically 50 Ω. Measured average current $I_{avg}$ from a diode is related to the average of the square of the diode voltage V according to equation (3), and the average of the square of V is related to average power using equation (4). Therefore average power P can be determined from average diode current $I_{avg}$ according to the equation $$P = I_{avg}/2aR \quad (5)$$

The power range over which a real diode operates according to the square law is limited. The typical square law operating range for a real diode is approximately −70 dBm to −20 dBm. It is desirable to have a power sensor which can operate over a much greater range.

SUMMARY OF THE INVENTION

In accordance with the present invention, a diode power meter provides a dual mode of operation—a first mode in the square law operating range of the diode, and a second mode where operation is provided continuously through the square law, transition, and linear regions of a diode. The second mode will be referred to herein as a "CW mode". In accordance with the invention using the first square-law operating mode, power measurements can be over a much greater range than the square-law dynamic range for a single diode. In the CW mode, unmodulated CW signal power can be measured outside the square law operating range of a diode.

A power meter in accordance with the present invention includes multiple diodes to enable measurement of power within a diode square law operating range over a greater range than with a single diode in the first square law mode. A manifold made up of power dividers distributes a signal input to the power meter to the diodes. Different attenuations are provided to each diode so that the square law operating range for each diode covers a different power range. By selecting the appropriate diode output for power measurements, the overall square law operating range for the power meter will be greater than a power meter using a single diode.

The power meter in accordance with the present invention includes a memory map of voltage vs. power in the square law, transition, and linear region of one diode measured for an unmodulated CW input for the CW mode. The diode detector with the least attenuation is the best candidate for measurements in the CW mode since the greater detected output voltage will limit the effect of noise. The map of voltage vs. power enables power to be measured for unmodulated CW signals provided to the power meter which are beyond the square law operating region for the diodes of the power meter.

BRIEF DESCRIPTION OF THE DRAWINGS

Further details of the present invention are explained with the help of the attached drawings in which.

DETAILED DESCRIPTION

Figure 1:
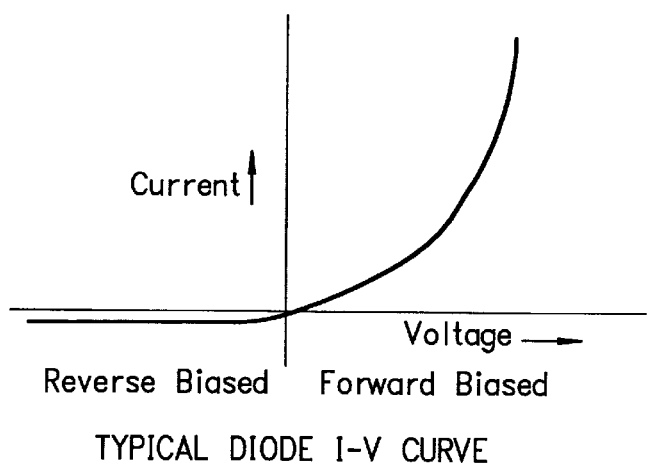
FIG. 1 shows a current vs. voltage relation for an ideal diode.
Figure 2:
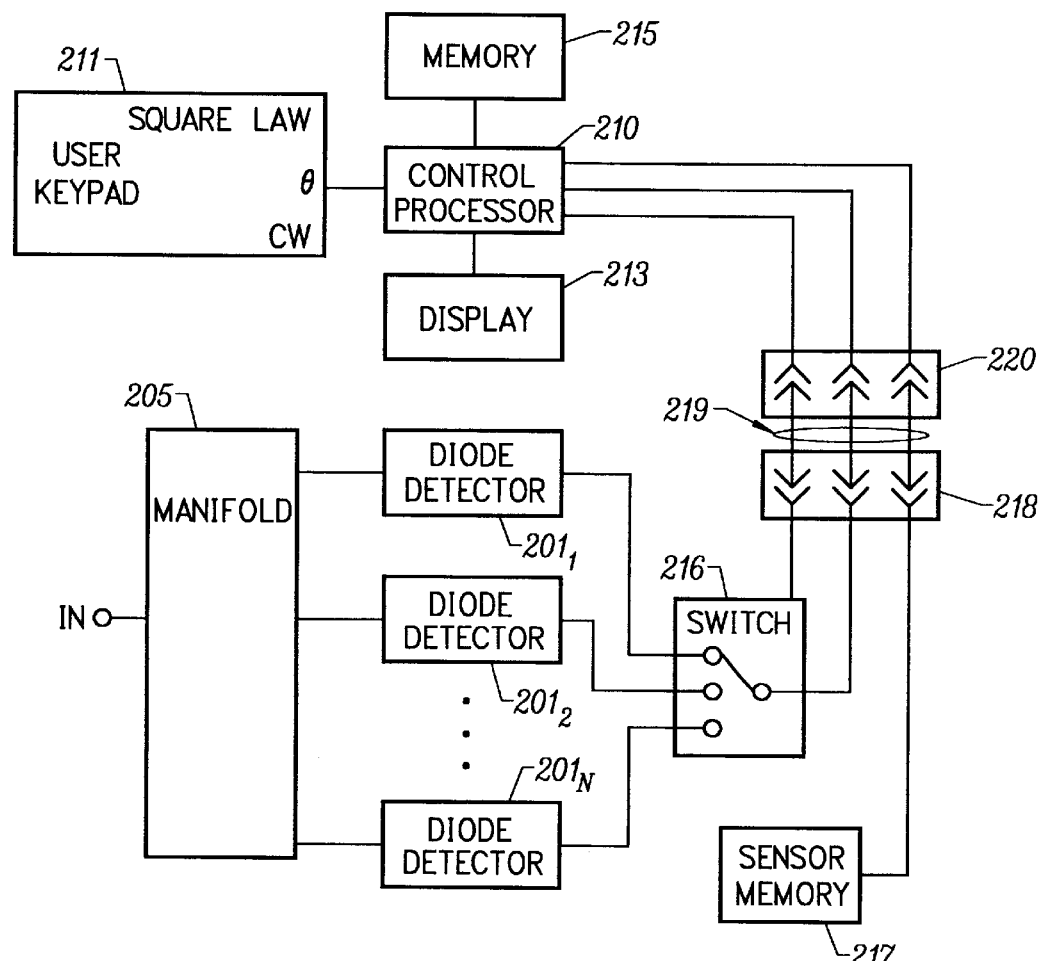
FIG. 2 shows a block diagram of components of a power meter in accordance with the present invention.

FIG. 2 shows a block diagram of components in accordance with the present invention. As shown, the present invention includes a number of diode detectors $201_1$–$201_N$. An input signal to the power meter is distributed to the diode detectors through a manifold 205. The outputs of the diode detectors are provided to an electronic switch 216 that is controlled by control processor 210. The switch 216 provides a single output of one of the diode detectors to the control processor 210 via multi-conductor connector 218, multi-conductor cable 219 containing 3 lines, and multi-conductor connector 220. The switch position of switch 216 is controlled by the control processor 210 through multi-conductor connector 218, multi-conductor cable 219 comprising 3 lines, and multi-conductor connector 220. A user keypad 211 allows user control of the control processor 210. With the power meter providing a dual mode of operation, a switch can be included on the keypad as shown to select between a square law operation mode and a CW operation mode. Without such a switch, the keypad can be used to select the operation mode. Information is displayed from the control processor 210 to a display 213, and data can be stored in the memory 215 from the processor 210.

For square law measurements, the manifold 205 provides a different attenuation to each of the diode detectors so that the square law operation region of each diode covers a different portion of the total measurement range of the power meter with minimal overlay. Power in a square law mode can be measured by selecting the diode detector output based on a maximum detection voltage. The output can be selected via switch 216 by a user, or by processor 210 and provided to display 213. Over the square law detection range of the diode detectors, a true RMS or average power measurement can be made with accuracy independent of any modulation impressed on the RF signal.

Power from a continuous wave (CW) signal without modulation can also be measured accurately with a diode detector, even when the diode detector is operating beyond its square law region and into its transition and linear operation regions. Since detection voltage vs. input power characteristics on a diode detector is monotonic, a higher input power always results in a higher detected voltage. A power meter can, thus, measure CW input power in the absence of modulations accurately by storing and recalling a map of voltage vs. power.

Accordingly, to enable unmodulated CW measurements to be made in transition and linear operating regions, known CW power levels are detected using one of the diodes $201_1$–$201_7$, and a map of the diode output voltage vs. power level of the CW signal is stored in sensor memory 217. Upon connecting the sensor to the rest of the meter via multi-conductor connector 218, multi-conductor cable 219 comprising 3 lines, and multi-conductor connector 220, voltage vs. power level is retrieved by the control processor 210 from sensor memory 217. The processor then store the voltage vs. power level map into its own memory 215. The diode detector with the least attenuation is the best candidate for the diode used for mapping since it will provide a greater output voltage and will least likely be affected by noise. Once a map is made, unmodulated CW measurements can be made using the diode detector and the mapped values from memory 215 used by the control processor 210 to display the actual CW signal power level using display 213.

In sum, the power meter in accordance with the present invention can provide two modes of operation. In a first square law, or average, mode the meter will be able to measure modulated and unmodulated signal power with good accuracy. The diode sensor selected to determine power will be operating in a square law region, and therefore the detected voltage will tend to be small. With a low detected voltage, the power meter will require more time to read the output voltage due to noise. In the second CW mode, the diode detector used will more likely operate in a transition or linear region where detector output voltages are high. Higher detector voltages result in faster power measurements, however, input power must be in unmodulated CW for accurate measurements.

Figure 3:
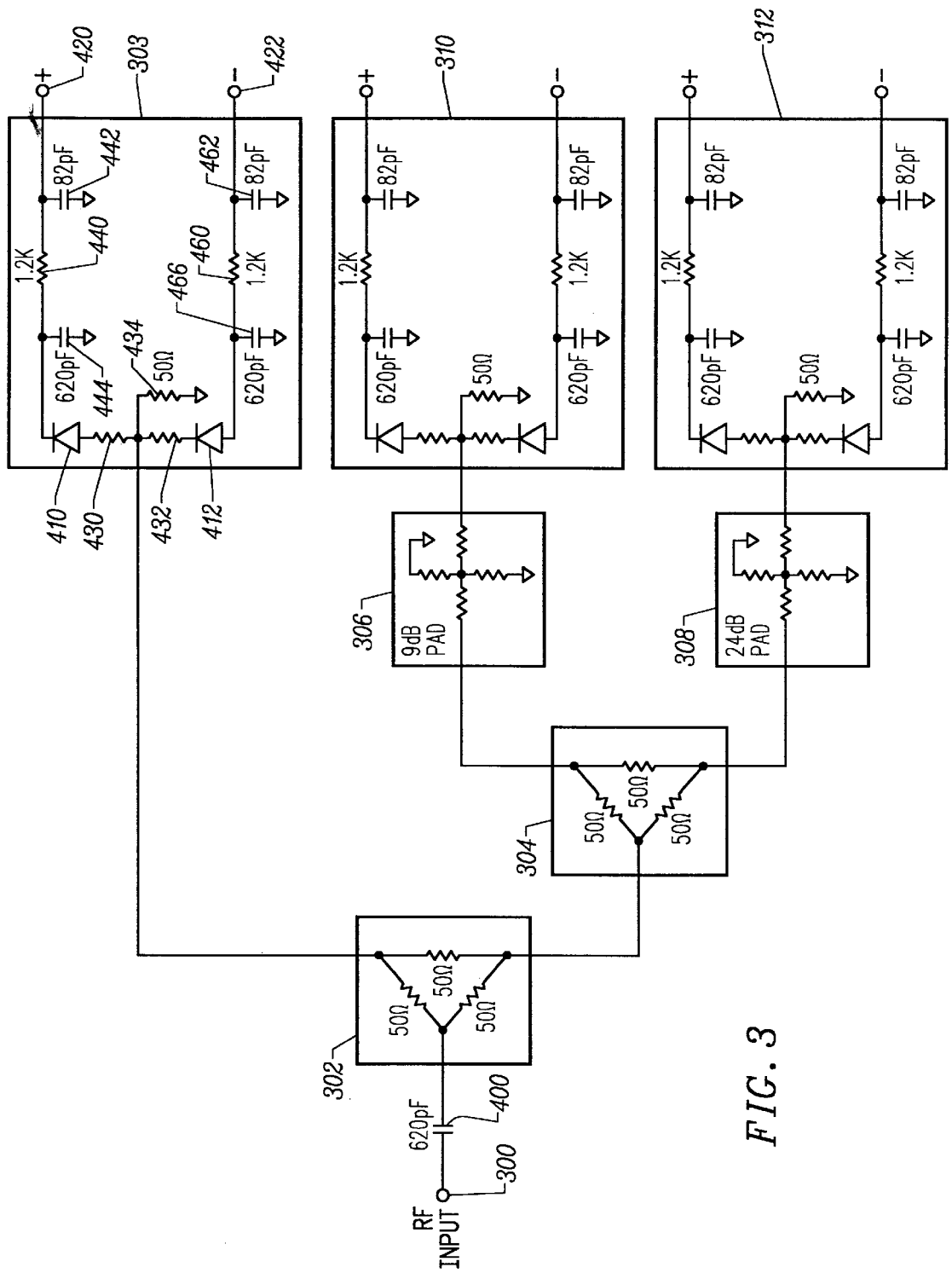
FIG. 3 shows components for an embodiment of the power meter of FIG. 2.

FIG. 3 shows more details of an embodiment of components of FIG. 2, including three separate diode detectors. The power meter receives an input signal at the input 300. Power dividers 302 and 304 and attenuators 306 and 308 form a manifold to distribute a signal at the input 300 to detectors 303, 310 and 312. The power divider 302 divides the signal at input 300 to provide inputs to diode detector 302 and the power divider 304. Because the signal at input 300 is divided in half at the outputs of power divider 300, the power divider is shown as providing 6 dB of attenuation. The power divider 304 divides the signal at its input to provide inputs to a 11 dB attenuator 306 and to a 28 dB attenuator 308. The output of attenuator 306 is then provided to diode detector 310. The output of attenuator 308 is provided to diode detector 312.

The diode detectors 303, 310 and 312 operate by providing the input power to a diode and measuring the resulting average diode current. Average diode current $I_{avg}$ is determined by providing the diode current to a capacitor of an RC circuit and measuring voltage on the capacitor. Since the average input power is related to average diode current Iavg, using the square law relation of equation (5), the average input power can be determined by measuring the voltage across the capacitor. Because the upper limit of the diode I-V curve where the square law applies is approximately −20 dBm, using multiple diode detectors with different input attenuation values enables the power meter to function accurately to higher power, and thus to a wider dynamic range, For the device of FIG. 3. total attenuation to diode detector 303 is 6 dB, the total attenuation to diode detector 310 is 23 dB, and the total attenuation to diode detector 312 is 40 dB. For input signals of −64 dBm to −14 dBm, the output from diode detector 302 will provide results in its square law operating range. For signals from −14 dBm to +3 dBm the output of diode detector 310 will provide results in its square law operating range. And for signals from +3 dBm to +20 dBm the output of detector 312 will provide results in its square law operating range.

Figure 4:
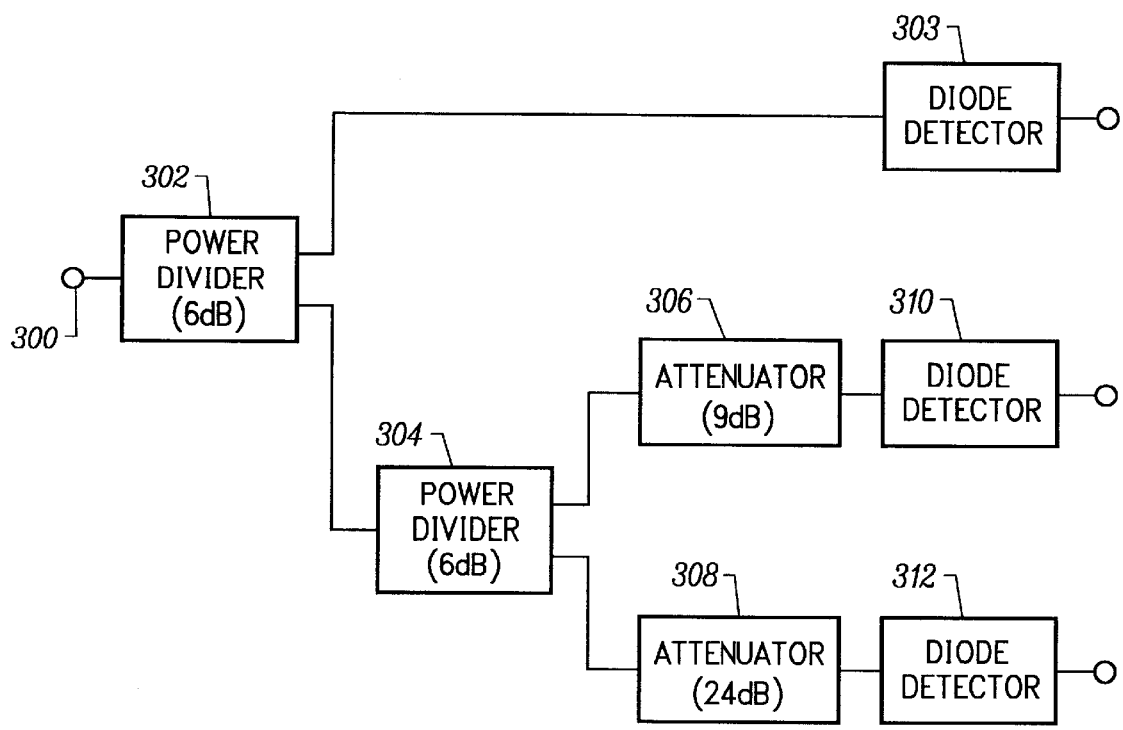
FIG. 4 shows detailed components for an embodiment of the power meter of FIG. 3.

Although FIGS. 3 and 4 show input power distributed to three diode detectors, more or less detectors can be used depending on user needs. For instance, if a power meter with only a 67 dB range is needed, only two diode detectors might be used. If a range greater than 84 dB is needed, more than three detectors might be needed. Also, although diodes 310 and 312 are assumed to use a 17 dB portion of their square law region to optimize measurement speed vs. dynamic range, these diodes may operate over lower power portions of their square law regions to increase overall system dynamic range. Attenuation values may be chosen so that each diode covers a desired portion of a total dynamic range for the power meter desired.

FIG. 4 shows even more detailed components for an embodiment of the power meter of FIG. 3. The RF input 200 of FIG. 4 provides a signal through a small capacitor 300, shown as 620 pF, to block DC signals from the power divider input. The power dividers 302 and 304 are composed of 50 Ω resistors, one connected from a power divider input to each output, and one connected between the outputs to provide a match. The attenuators 206 and 208 each include series resistors connecting one of the power divider outputs to a diode detector input. A central terminal of the series resistors of the attenuators 306 and 308 is then connected by two parallel resistors to ground. Resistor values in the attenuators 306 and 308 are chosen to provide desired attenuation values.

Each diode detector 303, 310 and 312 in FIG. 4 has an identical configuration, so explanation of the circuitry will be described with respect to diode detector 303. The diode detector 303 includes two separate diodes 410 and 412. Diode 410 is used to provide a signal for a positive output 420 to account for a positive half of the cycles of the input signal, while diode 412 is configured to provide a signal for a negative output 422 to account for a negative half of the cycles of the input signal. The pn-diode 410 has a p-terminal connected to the output of divider 302 by a resistor 430, while diode 412 has an n-terminal connected by a resistor 432 to the output of divider 302. A 50 Ω resistor 434 connects the output of divider 302 to ground to provide shunt conductance for transmission line matching.

The n-terminal of diode 410 is connected through an RC circuit made up of resistor 430 and capacitor 444 to provide a positive output voltage. The capacitor 444 provides a voltage representative of the average current through diode 410. The RC low pass filter made of resistor 440 and capacitor 442 provides switch noise filtering to the positive voltage which is applied to output 420.

Similar to the RC circuit with resistor 330 and capacitor 444, the detector 303 includes an RC circuit with resistor 432 and capacitor 466 to provide a capacitive voltage representative of the average current through diode 412. An RC low pass filter made of resistor 460 and capacitor 462 provides switch noise filtering to the negative voltage applied to the output 422. The outputs 420 and 422 are differential outputs that minimize measurement errors introduced by thermoelectric effects from dissimilar metals.

Although detectors are shown with both positive and negative outputs, such as outputs 420 and 422, a detector with less circuitry to provide only a positive or negative output may be used. Also, although specific values for some components are shown, other values might be used depending on user design considerations.

Figure 5:
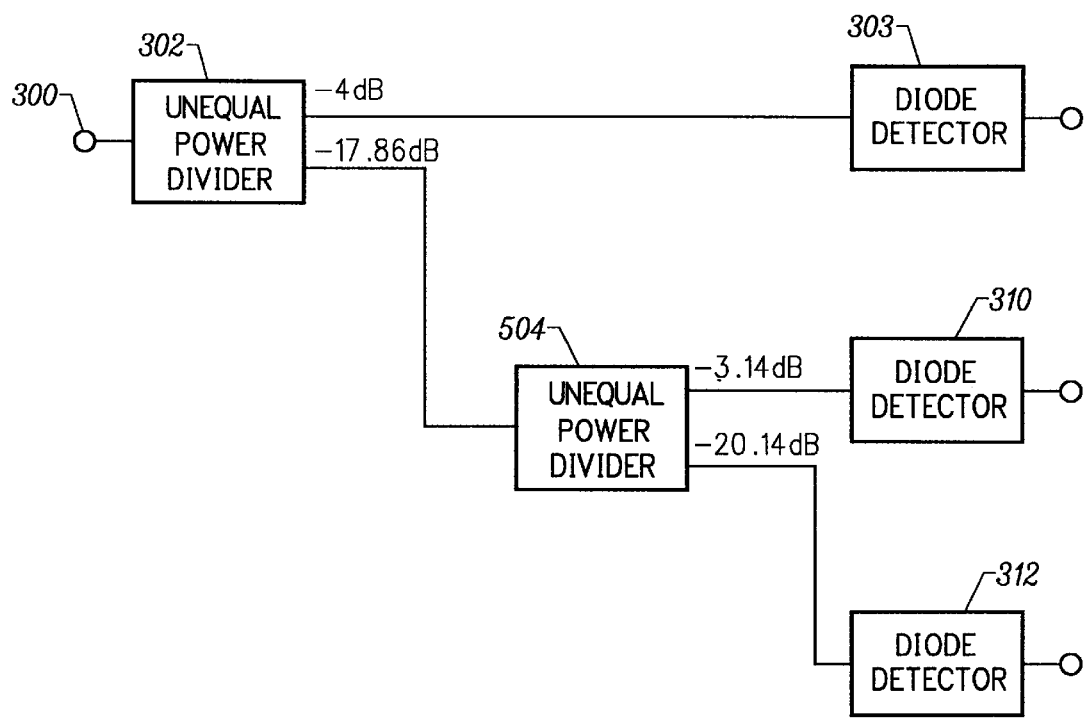
FIG. 5 shows components for an embodiment of the power meter of FIG. 2 which uses unequal power dividers to eliminate the need for attenuators.

FIG. 5 shows an alternative embodiment of components for the power meter of FIG. 2 with a manifold using unequal power dividers 502 and 504 to distribute a signal to diode detectors and eliminate the need for separate attenuators 303, 310 and 312 as used in the circuit of FIG. 3. Unequal power dividers also improve sensitivity by 2dB with attenuation values shown in FIG. 5. As shown, the unequal power divider 502 distributes an input signal from input node 300 with a −4 dB attenuation to diode detector 303, and with a −17.86 dB attenuation to the unequal power divider 504. The full 6 dB provided between the input 300 and diode detector 303 by the power divider 302 of FIG. 3 does not have to be provided since divider 502 of FIG. 5 uses an unequal power division.

The unequal power divider 504 divides the signal from the divider 502 to provide an additional −3.14 dB attenuation to diode detector 310, and an additional −20.14 dB attenuation to diode detector 312. As with the divider 504, more flexibility is provided than with the divider 304 of FIG. 3 since an attenuation other than 6 dB can be provided to each leg. With the attenuations shown provided by power dividers 502 and 504, the total attenuation provided between the input 300 and diode 303 is 4 dB, between input 300 and diode detector 310 is 21 dB, and between the input 300 and diode detector 312 is 38 dB. Although specific attenuation values are shown for the power dividers 502 and 504, other power divisions may be utilized to achieve desired attenuations between the input 300 and the diode detectors 303, 310 and 312.

Figure 6:
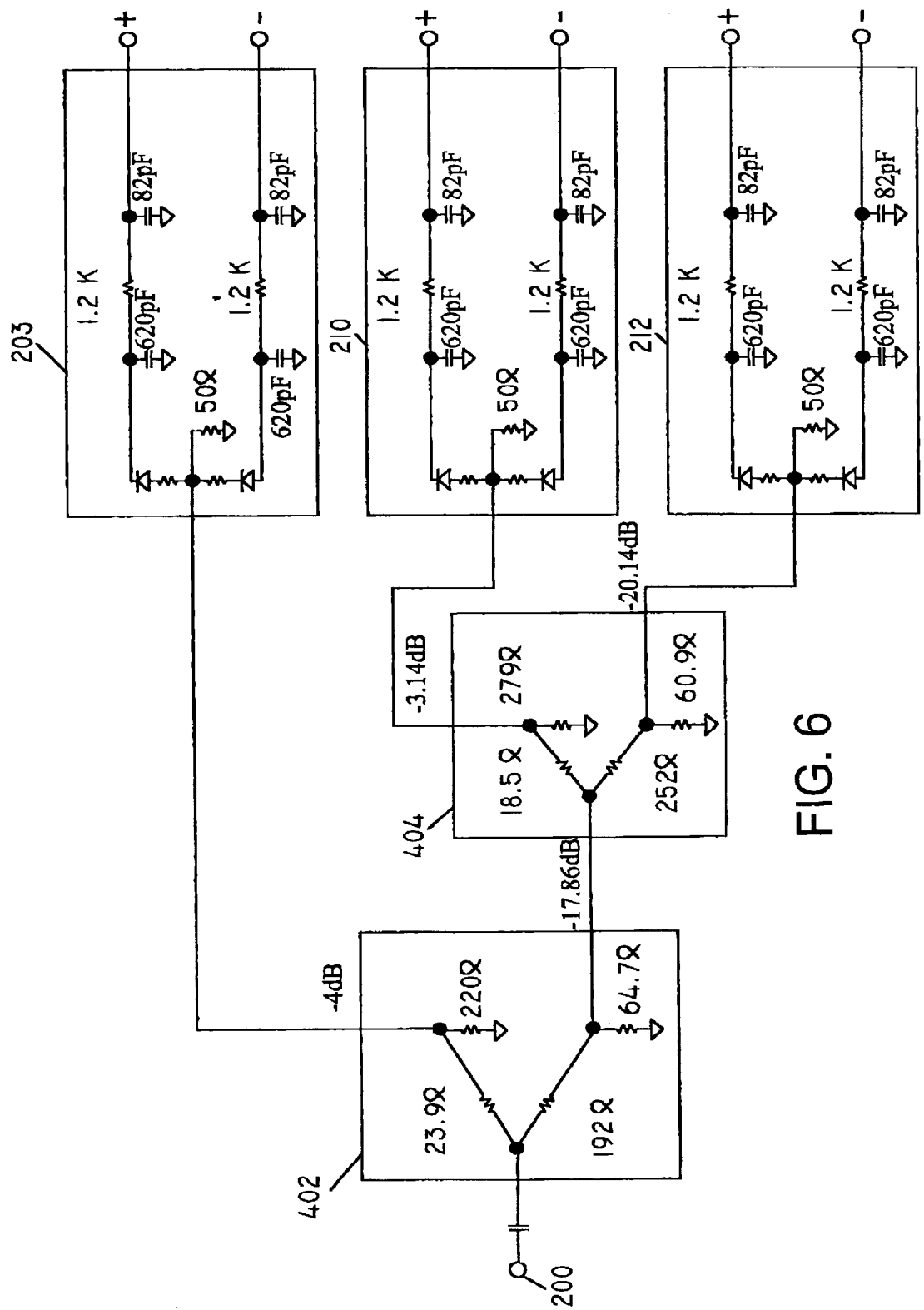
FIG. 6 shows detailed components for an embodiment of the power meter of FIG. 5.

FIG. 6 shows detailed components for the power meter of FIG. 5. As shown, the unequal divider 502 includes a 23.9 Ω resistor and a 192 Ω resistor providing the signal from the input node 300 to other terminals of the divider 502. The 23.9 Ω and 192 Ω resistors replace the equal 50 Ω resistors of the divider 302 of FIG. 3 to create the unequal −4dB and −17.86 dB attenuations shown. A 320 Ω resistor connects one terminal of the 23.9 Ω resistor of divider 502 to ground while a 64.7 Ω resistor connects the 193 Ω resistor to ground to provide a 50 Ω match at all terminals.

The unequal divider 504 includes a 18.5 Ω resistor and a 252 Ω resistor providing the signal from the divider 502 to diode detectors 310 and 312. The 18.5 Ω and 252 Ω resistors create the unequal −3.14 dB and −20.14 dB attenuations shown. A 279 Ω resistor connects the 18.5 Ω resistor of divider 504 to ground, while a 60.9 Ω resistor connects the 252 Ω resistor to ground to provide a 50 Ω match at all terminals of the divider 504.

Components of the diode detectors 303, 310 and 312 are the same as the components shown in FIG. 4 and function in the same manner described with respect to FIG. 4.

With a power meter providing the attenuations shown in FIGS. 5 and 6 between the input 300 and diode detectors 303, 310 and 312, a first diode in detector 303 can operate in its square law range for measurement of an input signal with power from −66 dBm to −16 dBm. Further, a diode in the detector 310 can operate in its square law range for input signal powers from −16 dBm to +1 dBm, and a diode in detector 312 can operate within its square law region from +1 dBm to +18 dBm. By measuring average current from the appropriate diode, a power sensor with components shown in FIG. 6 will have a +18 dBm to −66 dBm operating range. The circuit with component values shown in FIG. 6 will thus have 2 dB more sensitivity than the components shown in FIG. 4, and will not require separate attenuators.

Although the present invention has been described above with particularity, this was merely to teach one of ordinary skill in the art how to make and use the invention. Many additional modifications will fall within the scope of the invention, as that scope is defined by the claims which follow.

What is claimed is:

1. A method for measuring power of an input signal comprising the steps of:

distributing the input signal to diode detectors;

measuring a voltage from one of the diode detectors and indicating a power level of the input signal based on the measured voltage when a first mode is selected; and determining from a memory map an indication of the power level of the input signal based on the measured voltage from one of the diode detectors when a second mode is selected.

2. The method of claim 1, further comprising the step of:

selecting the second mode when the input signal is an unmodulated CW signal, and a faster measurement is desired.

3. The method of claim 2, further comprising the step of:

selecting the first mode when the input signal is a modulated signal.

4. The method of claim 2, further comprising the step of:

selecting the first mode when the input signal is not a CW signal.

5. The method of claim 1, further comprising the step of:

attenuating the distributed input signal so that a different attenuation is provided to each of the diode detectors.

6. The method of claim 5, wherein when the first mode is selected, the one of the diode detectors used in the step of measuring a voltage is the diode detector which is operating in a square law region in response to the input signal.

7. A power meter comprising:

diode detectors, each having an input coupled to receive an input signal provided to the power meter, and having an output;

a memory storing a voltage vs. power map for an unmodulated CW signal;

a display;

a controller coupled to the output of the diode detectors, to the memory and to the display, wherein the controller provides an indication of the power level of the input signal to the display in direct proportion to a voltage received from a given one of the diode detectors when a first mode is selected, and wherein the controller provides an indication of the power level of the input signal to the display based on a comparison of a voltage from a particular one of the diode detectors with the memory map when a second mode is selected.

8. The power meter of claim 7, further comprising:

a power distribution manifold having an input forming an input to the power meter and outputs coupled to the inputs of the diode detectors, the power distribution manifold for distributing a signal provided from the input of the power meter to the diode detectors so that a different attenuation is provided between the power meter input and each one of the diode detectors.

9. The power meter of claim 7, wherein the diode detectors each comprise:

a resistor having a first terminal coupled to the input of the diode detector, and a second terminal a diode having a first terminal coupled to the second terminal of the resistor, and having a second terminal coupled to the output of the diode detector; and a capacitor coupling the second terminal of the diode to a ground connection.

10. The power meter of claim 9, further including a filter comprising:

a second resistor coupling the second terminal of the diode to the output of the diode detector; and a capacitor coupling the output of the diode detector to a ground connection.

11. The power meter of claim 7, wherein the diode detectors each comprise:

a first resistor having a first terminal coupled to the input of the diode detector, and having a second terminal;

a first pn-diode having a p-terminal coupled to the second terminal of the first resistor, and having an n-terminal coupled to a + output of the diode detector;

a first capacitor coupling the n-terminal of the first pn-diode to a ground connection;

a second resistor having a first terminal coupled to the input of the diode detector, and having a second terminal;

a second pn-diode having an n-terminal coupled to the second terminal of the second resistor, and having a p-terminal coupled to a − output of the diode detector; and a second capacitor coupling the p-terminal of the second pn-diode to a ground connection.

12. The power meter of claim 11, wherein the diode detectors each further comprise:

a third resistor coupling the n-terminal of the first pn-diode to the + output of the diode detector;

a third capacitor coupling the + output of the diode detector to a ground connection;

a fourth resistor coupling the p-terminal of the second pn-diode to the − output of the diode detector; and a fourth capacitor coupling the − output of the diode detector to a ground connection.

13. The power meter of claim 8, wherein the power distribution manifold comprises:

at least one power divider connected to distribute power from the input of the power meter to an input of each of the diode detectors.

14. The power meter of claim 13, wherein the power distribution manifold further comprises at least one attenuator, each attenuator connecting a power divider output to the input of one of the diode detectors.

15. The power meter of claim 13, wherein the at least one power divider provides an unequal power division to enable the different attenuation to be provided between the power meter input and each one of the diode detectors.

16. The power meter of claim 7 further comprising:

a switch having switching terminals each coupled to an output of one of the diode detectors, and a primary terminal coupled to the controller.

17. The power meter of claim 16, wherein the controller controls the switch to connect to the output of one of the diode detectors which is operating in a square law region to provide the indication of the power of the input signal when the first mode is selected.

* * * * *